(12) United States Patent
Chong et al.

(10) Patent No.: US 6,891,257 B2
(45) Date of Patent: May 10, 2005

(54) PACKAGING SYSTEM FOR DIE-UP CONNECTION OF A DIE-DOWN ORIENTED INTEGRATED CIRCUIT

(75) Inventors: David Chong, Penang (MY); Hun Kwang Lee, Penang (MY); Howard Allen, Limington, ME (US); Stephen Martin, South Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/823,600

(22) Filed: Mar. 30, 2001

(65) Prior Publication Data

US 2002/0140070 A1 Oct. 3, 2002

(51) Int. Cl.[7] .............................................. H01L 23/02
(52) U.S. Cl. ........................ 257/678; 257/693; 257/697
(58) Field of Search ................................ 257/678, 693, 257/697

(56) References Cited

U.S. PATENT DOCUMENTS

| | | | |
|---|---|---|---|
| 5,637,916 A | | 6/1997 | Joshi |
| 5,731,630 A | * | 3/1998 | Suyama et al. ............. 257/701 |
| 5,765,280 A | | 6/1998 | Joshi |
| 5,793,101 A | * | 8/1998 | Kuhn ......................... 257/676 |
| 6,064,116 A | * | 5/2000 | Akram ........................ 257/700 |
| 6,075,710 A | | 6/2000 | Lau |
| 6,091,140 A | | 7/2000 | Toh et al. |
| 6,140,708 A | | 10/2000 | Lee et al. |
| 2001/0033017 A1 | * | 10/2001 | Wang et al. ................. 257/698 |

OTHER PUBLICATIONS

Harper, Electronic Packaging and Interconnection Handbook, 1991, McGraw–Hill, pp. 1.9–10 and 1.59.*

* cited by examiner

*Primary Examiner*—Nathan J. Flynn
*Assistant Examiner*—Leonardo Andújar
(74) *Attorney, Agent, or Firm*—Cesari and McKenna LLP; Edwin H. Paul, Esq.

(57) ABSTRACT

A die attach package for connecting a die or chip of die-down orientation to a printed circuit board in a die-up orientation. The package includes a substrate with leads that may be traces terminating in vias or that may be the leads of a lead frame. The traces or the leads of the lead frame are modified such that they pass under the die when the die is attached. The traces or leads are routed under the die such that proper connections are established from the topside of the die to the appropriate mount locations of the printed circuit board. The die is attached to the substrate using a non-electrically-conductive material. This packaging enables a fabricator to make die of one orientation type, die down, and use that die in a die-up package, thereby saving on fabrication costs.

10 Claims, 3 Drawing Sheets

PACKAGING SYSTEM FOR DIE-UP CONNECTION OF A DIE-DOWN ORIENTED INTEGRATED CIRCUIT

BACKGROUND OF THE INVENTION

1. Field of the Invention

The present invention relates to integrated circuit packaging. More particularly, the present invention relates to the arrangement for attaching a die-down-oriented integrated circuit in a die-up-oriented package such a chip scale package land grid array or a lead frame.

2. Description of the Prior Art

Integrated circuits are connected to other integrated circuits or other electrical devices via printed circuit boards having metal connectors. The integrated circuits are formed on sections of semiconductor wafers or die using well-known fabrication techniques. An integrated circuit of a die is attached to a substrate designed to provide structural support, thermal protection, and a means to fan out metal connectors or traces from the circuit to the printed circuit board. The combination of the integrated circuit and its substrate/metal connectors is referred to as the integrated circuit package. The package is essentially a housing that is used either to plug the device into sockets of the circuit board or to solder the device onto surface contacts of the board.

The most common type of semiconductor packaging to have been used is the small-scale outline package such as shown in FIG. 1. That package includes a semiconductor chip 10 supported on and attached to a die attach pad (DAP) 11 encapsulated in an encapsulating material 12. The chip 10 includes bond pads represented by pads 13 and 14 connected to bond wires 15 and 16 that are connected to respective lead frames 17 and 18 of a lead frame. The lead frame connects the chip 10 to traces of the printed circuit board. The bond pads of the chip 10 are located on the top surface of the chip 10. The desired connection of the chip 10 to the printed circuit board has pads 13 and 14 connected to the lead frames 17 and 18 on the same side of the package.

FIG. 2 illustrates an alternative package design. That package includes mounting of the die or chip 20 on a DAP 21. Contacts 22 and 23 of the chip 20 are coupled to a bottom side of the lead frame by way of wire bonds 24 and 25 to lead frame leads 26 and 27. The construction process for producing the package of FIG. 2 is substantially the same as the process used to produce the package of FIG. 1. The package of FIG. 2 is commonly referred to as a die-down package while that of FIG. 1 is a die-up package.

The packaging types described must be designed with common connector protocols in mind. That is, there are conventions for the ways in which electronic devices are interconnected, requiring the chip manufacturers to fabricate chips and, more specifically, their contacts, with a particular orientation. The contact pads of the packages shown in FIGS. 1–3 must be positioned to match the mounting configuration established on the printed circuit board. For example, a chip to be coupled to a high-potential power rail, a low potential power rail, two inputs and two outputs must be configured so that the chip's contacts are matched to the traces associated with each of those elements. For a die-down package such as the package shown in FIG. 2, the chip is fabricated so that its contacts are on what becomes the bottom of the structure. On the other hand, a chip packaged in a standard lead frame package such as that shown in FIG. 1, is fabricated so that its contacts are on what is the top of the structure. Thus, there are two types of chip orientations that must be fabricated as a function of the particular packaging type employed. Those chips that are "die down" and those that are "die up." While it is common practice to fabricate both types of die orientations, it would be more cost effective to be able to fabricate just one type that could be used in either type of package configuration.

Therefore, what is needed is a packaging arrangement that would permit the connection of a die-down chip in a die-up configuration.

SUMMARY OF THE INVENTION

It is an object of the present invention to provide a packaging arrangement that would permit the connection of a die-down chip in a die-up configuration.

This and other objects are achieved in the present invention by providing a connection substrate with traces or connection lines that run under the die. The die is a die fabricated as a die down one that is positioned on the substrate with the contacts on the side opposite that of the substrate so that it is in a die up position. Ordinarily, a die down die having its contacts located on the exposed side of the die would not be connectable in a die up package because the contacts of the die would be adjacent to the wrong traces or pins of the substrate. However, the substrate of the present invention includes those traces or pins as passing from one side of the die to the other so that correct connections may be established. Specifically, the connectors are routed under the die, allowing a die-down design to be wire bonded in a die-up package while maintaining the same external configuration associated with a die-up package. The substrate may be a ceramic or organic substrate or a standard lead frame. An electrically nonconductive attach material is used to connect the die to the substrate.

The packaging arrangement of the present invention allows a die manufacturer to fabricate die-down oriented die that may be used in a die-up package as well as a die-down package. Further, since the die may be coupled to a circuit board using connectors and traces, it is suitable for coupling a die-down die in a package that may otherwise be too small for flip chip packaging.

These and other advantages of the present invention will become apparent upon review of the following detailed description, the accompanying drawings, and the appended claims.

DESCRIPTION OF THE PREFERRED EMBODIMENTS OF THE INVENTION

Figure 1:
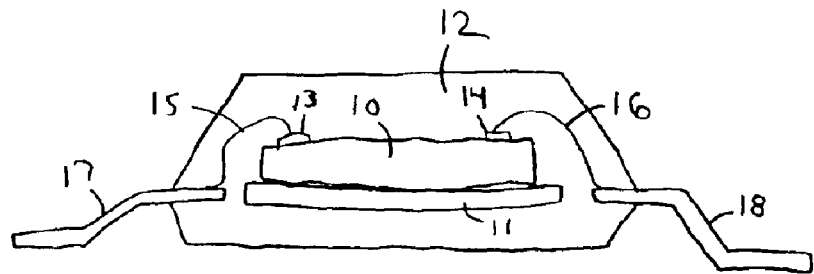
FIG. 1 is a cross-sectional side view of a lead frame-based die-up package of the prior art.
Figure 2:
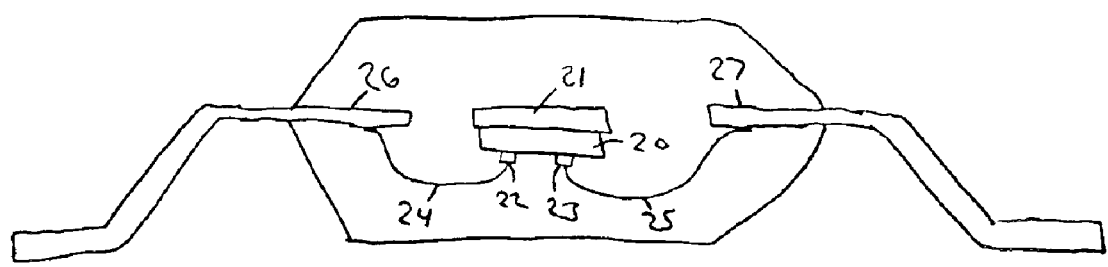
FIG. 2 is a cross-sectional side view of a lead frame-based die-down package of the prior art.
Figure 3:
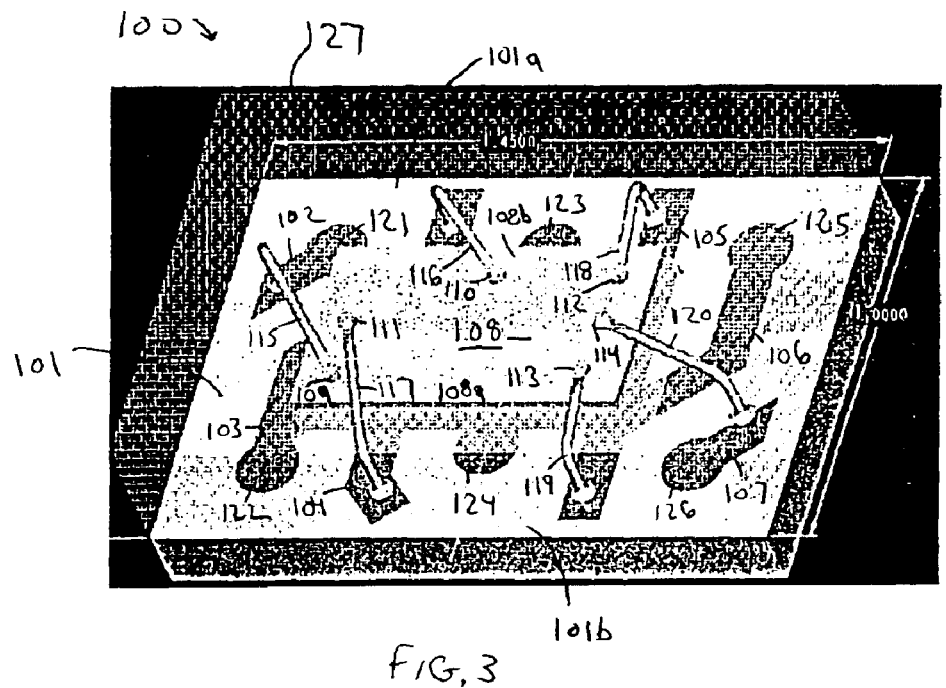
FIG. 3 is a perspective view of the die-down/die-up orientation package of the present invention with a die in place on a ceramic substrate.
Figure 4:
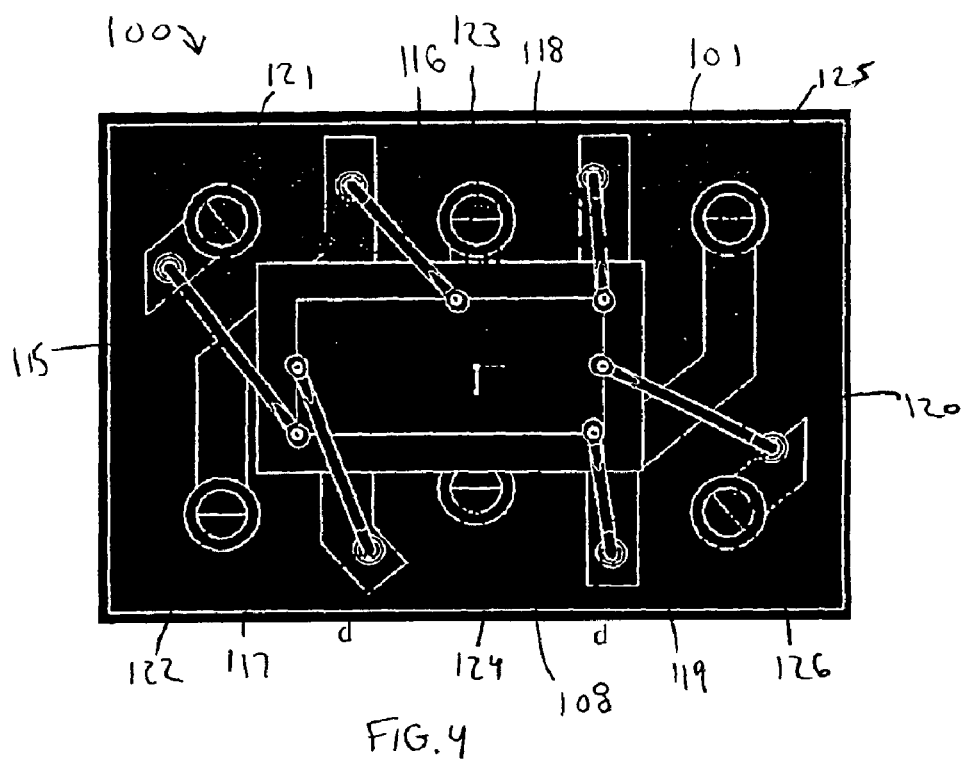
FIG. 4 is a top view of the substrate of the package of the present invention showing the trace routings that run under the die when in place.

A die package 100 of the present invention is shown in FIGS. 3 and 4. The package 100 includes a substrate 101 with a plurality of patterned traces 102–107 that provide connections from a die 108 to a printed circuit board (not shown). Although six traces have been shown, it is to be understood that more or fewer may be applied to the substrate 101 as a function of the particular contact requirements associated with the active components of the die 108. For the packaging arrangement shown in the drawings, the die 108 is of a die-down type such that its conductive contacts 109–114 would ordinarily be positioned to provide proper pinout when the die 108 is attached to the bottom of the substrate 101. That is, the die package 100 of the present invention enables orientation of the die 108 in a die up arrangement although the die 108 is fabricated with a die down orientation. The contacts 109–114 are connected to the traces 102–107 by way of connector wires 115–120. The arrangement of the wires 115–120 and the traces 102–107 effectively "flip-flop" the orientation of the contacts 109–114 so that proper coupling to vias 121–126 connected to the underlying printed circuit board is established.

The substrate 101 may be fabricated as a ceramic substrate or an organic substrate. It includes a first side 101a and a second side 101b. The die 108 is physically connected to the substrate 101 using a non-electrically-conductive material such as a thermally conductive epoxy, for example. The die 108 includes a first side 108a and a second side 108b, such that the first side 108a is opposite the first side 101a of the substrate 101. The same opposing relation can be said for the second side 108b of the die 108 and the second side 101b of the substrate 101. It is important that the die 108 not contact the substrate 101 directly in order to avoid shorting. In that regard, it is desirable to ensure that the adhering material spaces the die 108 from the substrate 101 while maintaining adequate physical support. The package 100 further includes an encapsulant 127 to seal the die 108 and connectors in to protect the substrate 101 and wire bonding stability. The traces 102–107 may be applied to the substrate 101 after substrate formation or as part of the substrate fabrication process.

Figure 5:
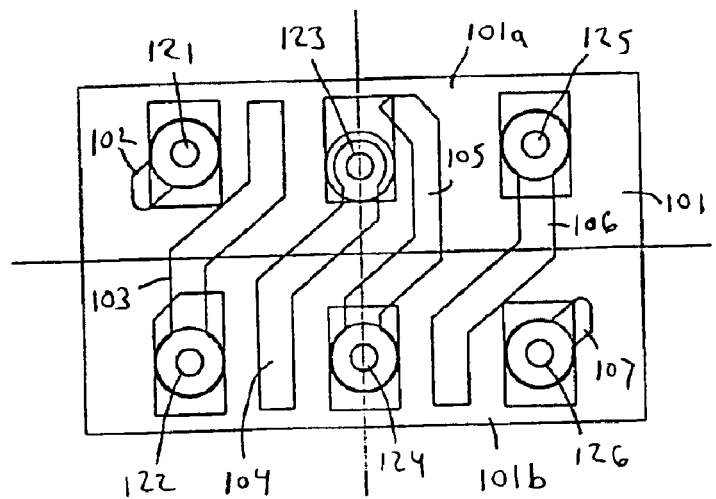
FIG. 5 is a top view of the package of the present invention without the die in place on the substrate.

As illustrated in FIG. 5, the traces 102–107 on the substrate 101 are arranged to pass under the die 108 when the die 108 is attached to the substrate 101. The traces 102-107 are routed in an organized manner so that contacts of the die 108 on the first side 108a are electrically connected to traces having vias on the second side 101b of the substrate 101 and the contacts on the second side 108b are electrically connected to traces having vias on the first side 101a of the substrate 101. As indicated, the traces 102–107 and the vias 121–126 may be established on the substrate 101 in any well known manner. A goal of the present invention shown in the drawings is to electrically connect contacts on one side of the die 108 to vias on the opposite side of the substrate 101. More generally, the present invention is directed to arranging traces and wire contacts so that a die-down die may be packaged in a die-up orientation.

Figure 6:
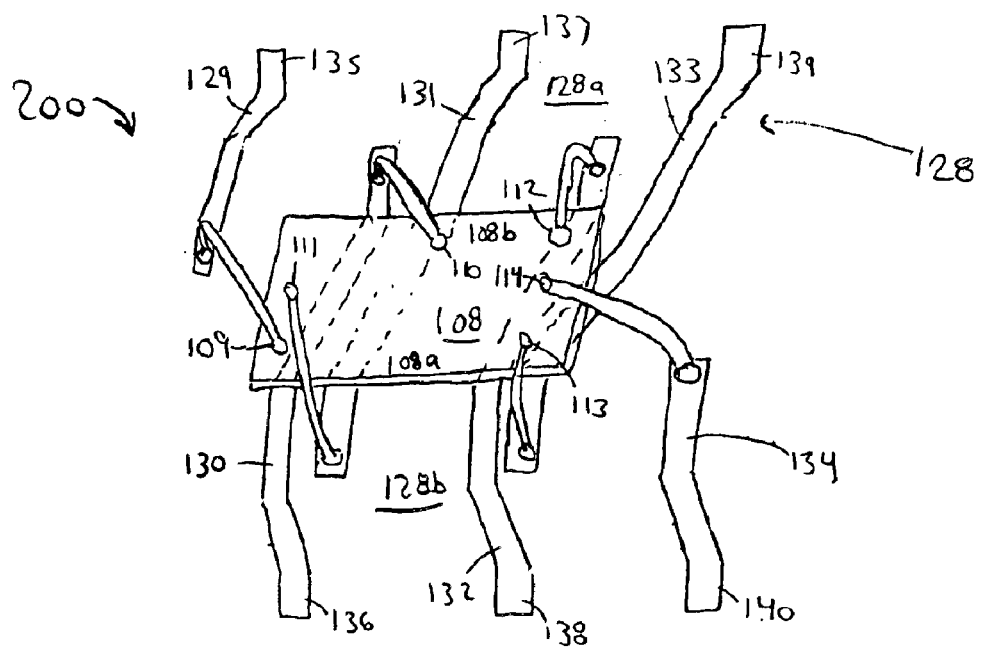
FIG. 6 is a perspective view of a second embodiment of the die-down/die-up orientation package of the present invention with a die in place on a lead frame.

Although the present invention has been described as a package system 100 designed to couple the die 108 to a substrate 101 including traces 102–107, it may alternatively be configured as an arrangement to couple the die 108 to a lead frame 128, as shown in FIG. 6. The package 200 of FIG. 6 includes a plurality of leads 129–134 that provide connections from the die 108 to a printed circuit board (not shown). Although six leads have been shown, it is to be understood that more or fewer may be applied as a function of the particular contact requirements associated with the active components of the die 108. For the packaging arrangement shown, the die 108 is of a die-down type such that its conductive contacts 109–114 would ordinarily be positioned for mounting the die 108 to the bottom side of the leads 129–134. That is, the die package 200 of the present invention enables orientation of the die 108 in a die up arrangement although the die 108 is fabricated with a die down orientation. The contacts 109–114 are connected to the leads 129–134 by way of connector wires 115–120. The arrangement of the wires 115–120 and the leads 129–134 effectively "flip-flop" the orientation of the contacts 109–114 so that proper coupling to paddle contacts 135–140 connected to the underlying printed circuit board is established. The leads 129–134 may then be connected to a printed circuit board in a well-known manner.

As illustrated in FIG. 6, the leads 129–134 of the lead frame 128 are arranged to pass under the die 108 when the die 108 is attached to the lead frame 128. The leads 129–134 are routed in an organized manner so that contacts of the die 108 on its first side 108a are electrically connected to paddles having circuit board contacts on a second side 128b of the lead frame 128 and the contacts on the second side 108b of the die 108 are electrically connected to paddles having board contacts on a first side 128a of the lead frame 128. The leads 129–134 may be fabricated in any well-known manner. The die 108 is connected to the lead frame 128 using a thermally conductive and electrically non-conductive material. The package 200 of FIG. 6 arranges the lead frame leads 129–134 so that a die-down die may be packaged in a die-up orientation.

While the invention has been described with reference to particular example embodiments, it is intended to cover all modifications and equivalents within the scope of the following claims.

What is claimed is:

1. A substrate for receiving a die-down die and providing electrical contacts re-orientated into a die-up orientation, the die-down die defining electrical contacts, the substrate comprising:

a plurality of electrically conductive traces defining first contacts, the first contacts arranged in an orientation to accept connector wires for making electrical connections from the electrical contacts of a single die-down die, if one was mounted, the plurality of electrically conductive traces running under and from one side to the opposite side of a single die down die, if one was mounted, and wherein the electrical traces define second contacts located on the opposite side relative to the first contacts, the second contacts arranged in a die up orientation, wherein the substrate can be placed into a package designed to accept a single die-up die, and wherein electrical connections may be made to the substrate's contacts as if it were a single die-up die.

2. The substrate of claim 1 further comprising:

a single die-down die mounted to the substrate, connector wires joining the electrical contacts of the die-down die to the first contacts on the conductive traces, and electrically conductive wires joining the second contacts on the conductive traces to contacts on a lead frame.

3. The substrate of claim 2 further comprising non-conductive means for attaching the substrate to the single die-down die.

4. The substrate of claim 2 wherein the single die-down die is an integrated circuit.

5. The substrate of claim 1 wherein the substrate comprises a material selected from the groups consisting of ceramic and organic.

6. A die attach package for receiving a single die with contacts arranged in a die-up orientation, the die attach package comprising:
- a substrate as defined in claim 1,
- a lead frame with contacts,
- connector wires joining the second contacts on the traces to the lead frame contacts.

7. The die attach package of claim 6 further comprising non-conductive means for attaching the substrate to the single die-down die.

8. The die attach package of claim 6 wherein the substrate comprises a material selected from the groups consisting of ceramic and organic.

9. The die package of claim 6 wherein the single die-down die is an integrated circuit.

10. The die attach package of claim 6 wherein the single die-down die includes components attached to the die-down die.

* * * * *